(12) United States Patent
Dandy et al.

(10) Patent No.: US 11,768,161 B2
(45) Date of Patent: Sep. 26, 2023

(54) ANALOG SIGNAL ISOLATOR

(71) Applicant: Tektronix, Inc., Beaverton, OR (US)

(72) Inventors: Jonathan S. Dandy, Portland, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 24 days.

(21) Appl. No.: 17/307,989

(22) Filed: May 4, 2021

(65) Prior Publication Data

US 2021/0255118 A1  Aug. 19, 2021

Related U.S. Application Data

(62) Division of application No. 15/693,371, filed on Aug. 31, 2017, now Pat. No. 10,996,178.

(60) Provisional application No. 62/524,295, filed on Jun. 23, 2017.

(51) Int. Cl.
*G01N 22/00* (2006.01)
*G01R 15/26* (2006.01)
*H03L 7/06* (2006.01)

(52) U.S. Cl.
CPC ............. *G01N 22/00* (2013.01); *G01R 15/26* (2013.01); *H03L 7/06* (2013.01)

(58) Field of Classification Search
CPC ........... G01N 22/00; G01R 15/26; H03L 7/06
See application file for complete search history.

(56) References Cited

U.S. PATENT DOCUMENTS

| 10,080,609 | B2 | 9/2018 | Hancock et al. |
| 2008/0290856 | A1* | 11/2008 | Hoffmann ............ G01R 15/26 324/96 |
| 2009/0189623 | A1* | 7/2009 | Campbell .......... G01R 1/06772 324/756.03 |

(Continued)

FOREIGN PATENT DOCUMENTS

| CN | 104269593 | 1/2015 |
| JP | 2015-530172 | 10/2015 |
| WO | 2014203808 | 12/2014 |

OTHER PUBLICATIONS

Japan Patent Office, Notice of Reasons for Refusal of Patent Application No. 2018-119291 dated Jun. 7, 2022, 4 pages, Tokyo, Japan.

(Continued)

*Primary Examiner* — Alvaro E Fortich
*Assistant Examiner* — Adam S Clarke
(74) *Attorney, Agent, or Firm* — Miller Nash LLP; Andrew J. Harrington

(57) ABSTRACT

Disclosed is a signal isolating test instrument, such as an electronics test probe. The instrument includes an input to receive a floating analog signal. An upconverter is employed to modulate the floating analog signal to a microwave frequency analog signal. An isolation barrier in the instrument prevents coupling of the floating analog signal to an earth ground. The instrument employs a microwave structure to transmit the microwave frequency analog signal across the isolation barrier via electromagnetic coupling. A downconverter is then employed to demodulate the microwave frequency analog signal to obtain a ground referenced test signal corresponding to the floating analog signal.

20 Claims, 11 Drawing Sheets

(56) References Cited

U.S. PATENT DOCUMENTS

2016/0374752 A1* 12/2016 Hancock ................ H01P 1/36
                                                                606/33
2018/0344400 A1   12/2018 Hancock et al.
2019/0257771 A1*  8/2019 Desmulliez ............ H01P 3/16

OTHER PUBLICATIONS

European Patent Office, Communication from the examining division regarding European patent application 18179391.0, dated Oct. 18, 2022, 6 pages, Munich, Germany.

* cited by examiner

ANALOG SIGNAL ISOLATOR

CROSS-REFERENCES TO RELATED APPLICATIONS

The present application is a divisional application of, and claims the benefit of, U.S. patent application Ser. No. 15/693,371, filed Aug. 31, 2017, now U.S. Pat. No. 10,996,178, issued May 4, 2021, which is incorporated herein by reference as if reproduced in its entirety.

TECHNICAL FIELD

This disclosure is directed to systems and methods associated with aspects of a test and measurement system, and, more particularly, to systems and methods for providing isolation between floating signals and ground referenced signals during signal testing.

BACKGROUND

Test and measurement systems are designed to receive signal inputs, for example from a Device Under Test (DUT), sample the signals, and display the result as a waveform. A test and measurement system, such as an oscilloscope may contain a connection to ground. The oscilloscope may also measure voltages as a difference between an input voltage and ground. However, in some cases, a user may wish to measure the voltage of a node relative to another node, both of which may float relative to ground. In other cases, a DUT may be designed with a floating ground, such that the DUT employs components without a direct connection to the oscilloscope's ground. In such cases, a direct connection between the DUT and the oscilloscope results in measurements taken in reference to the wrong ground, which may results in erroneous data, improper scaling, and may exceed the design constraints of the oscilloscope. For example, a pair of nodes operating at near one hundred Volts (V) would require the oscilloscope measure and display a hundred Volt value even if the difference between the two signals is about one Volt. This may result in obfuscating fine differential measurements due to the large base voltage value. In order to overcome these concerns, isolation systems may be employed to prevent signals in the DUT from becoming directly connected to the oscilloscope's ground.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
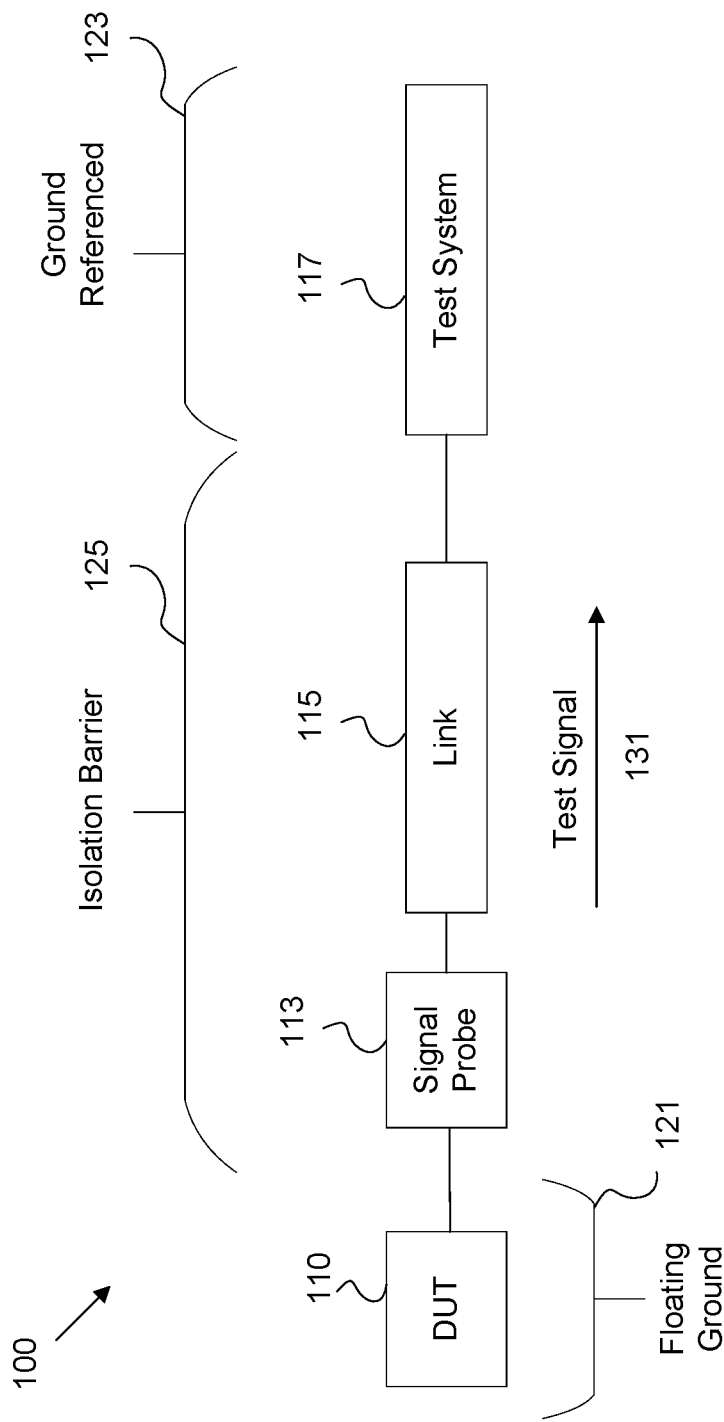
FIG. 1 is a schematic diagram of an example test network including an isolation barrier between a floating signal and a ground referenced test and measurement system.

Various isolation mechanisms may be employed to isolate floating signals from a grounded test instrument. For example, a fiber optic system may employ the floating signal to modulate an optical signal at the DUT. The optical signal is then converted back to the electrical domain at the test instrument. Such systems may require a separate power supply at the DUT, and hence may increase the complexity of the system. Further, optical technology may be expensive to implement. As another example, a transformer may magnetically couple the DUT to the test instrument while providing isolation. Such systems are limited to relatively low frequencies by parasitic capacitances within the transformer.

Disclosed herein is a mechanism for electromagnetically coupling a floating analog signal to a ground referenced test and measurement instrument over an isolation barrier. The isolation barrier is implemented between a DUT and a test and measurement system, for example in a signal probe, a link, and/or a test and measurement system input port/accessory. The mechanism employs an input to receive a floating analog signal and an upconverter to modulate the floating analog signal to a desired microwave frequency band (e.g. between about one Gigahertz (GHz) and about one hundred GHz). An isolation barrier is employed to isolate the DUT side of the circuit from ground. A microwave structure electromagnetically couples the microwave frequency analog signal across the isolation barrier, but does not couple signals outside of the desired microwave frequency band (e.g. sub-microwave signals) across the isolation barrier. A downconverter then demodulates the microwave frequency analog signal to obtain a ground referenced test signal corresponding to the floating analog signal. An example microwave structure may include a conductive waveguide with a gap at the isolation barrier. The gap may include a dielectric with a high breakdown voltage, such as KAPTON. As another example, the microwave structure may include a dielectric waveguide selected to maintain a total internal reflection at the microwave frequency band, and hence constrain the microwave frequency analog signal in the waveguide while preventing movement of out of band charge across the isolation barrier. As another example, the microwave structure may include a pair of differential input conductive traces electromagnetically coupled to a pair of differential output conductive traces across the isolation barrier. The traces may be positioned to share a virtual ground. The virtual ground may be an area where the voltage cancels out for the desired differential microwave signal, and hence acts as a ground, while not canceling out common-mode from the floating analog signal, and hence acts as an open circuit. The differential conductive traces may include stub traces, which may act as bias connections for the upconverter/downconverter. The stub traces may also perform impedance matching functions, which may increase the range of the microwave frequency band that can couple across the isolation barrier.

FIG. 1 is a schematic diagram of an example test network 100 including an isolation barrier 125 between a floating signal and a ground referenced test and measurement system. The test network 100 includes a DUT 110, a signal probe 113, a link 115, and a test system 117, which may be coupled as shown. A test signal 131 may be generated at the DUT 110 and communicated to the test system 117 for testing.

A DUT 110 is any signal source configured to conduct electrical signals, such as a test signal 131. The DUT 110 may be any device that a user may desire to test in order to determine relevant electrical characteristics. The test signal 131 may be any electrical signal generated by the DUT 110 and forwarded to the test system 117 for testing. The DUT 110 may include a floating ground 121. A floating ground 121 describes any electrical circuit where a direct connection to an earth ground does not exist. A floating ground 121 may occur when a user desires to test the electrical characteristics of two nodes relative to each other instead of relative to ground. A floating ground 121 may also exist in battery powered devices that employ a chassis as a local ground. A floating ground 121 may also exist when DUT components are grounded to a chassis as a local ground for noise reduction reasons. In any case, coupling a DUT 110 with a floating ground 121 may become dangerous to a user and/or test equipment if not properly isolated. Specifically, when a grounded test system is fully coupled to such a DUT 110, current in the DUT 110 (in addition to the test signal 131) may seek the earth ground via the test system 117 and/or via the user. This may result in injury to the user and/or damage to the test equipment.

Test system 117 may be any system configured to test the electrical characteristics of the DUT 110. For example, test system 117 may include an oscilloscope with components to generate waveforms based on a test signal 131, display such waveforms, perform frequency domain transforms, store calculated values based on the test signal 131, etc. The test system 117 may be ground referenced 123. A ground referenced 123 system is any system with electronics that couple to an earth ground.

The test system 117 may couple to the DUT 110 via a signal probe 113 and/or a link 115. A signal probe 113 is any device designed to couple to the DUT 110 to provide a connection for the test signal 131. The signal probe 113 may contain attachments to secure the link 115 to an appropriate section of the DUT 110 to maintain contact with the test signal 131. The link 115 may be any cable or other electrically conductive material capable of conveying the test signal 131 to the test system 117.

As noted above, when a floating ground 121 is employed at a DUT 110, an isolation barrier 125 may be employed to prevent current in the DUT 110 from seeking ground via the ground referenced 123 test system 117. The isolation barrier 125 may include any non-conductive material that acts as an open circuit and hence denies current a path to ground via the test system 117. The isolation barrier 125 may be implemented at the signal output of the DUT 110, in the signal probe 113, in the link 115, and/or at an input port of the test system 117. As discussed below, a microwave structure is employed to convey the test signal 131 across the isolation barrier 125 while denying Direct Current (DC) at the DUT 110 a direct path to ground across the isolation barrier 125. For purposes of simplicity, the isolation barrier 125 is generally discussed below as being implemented in a signal probe 113. However, the isolation barrier 125 and attendant microwave structure may be implemented at any point between a connection in the DUT 110 and the input of the test system 117 (including at an input port of the test system 117).

Figure 2:
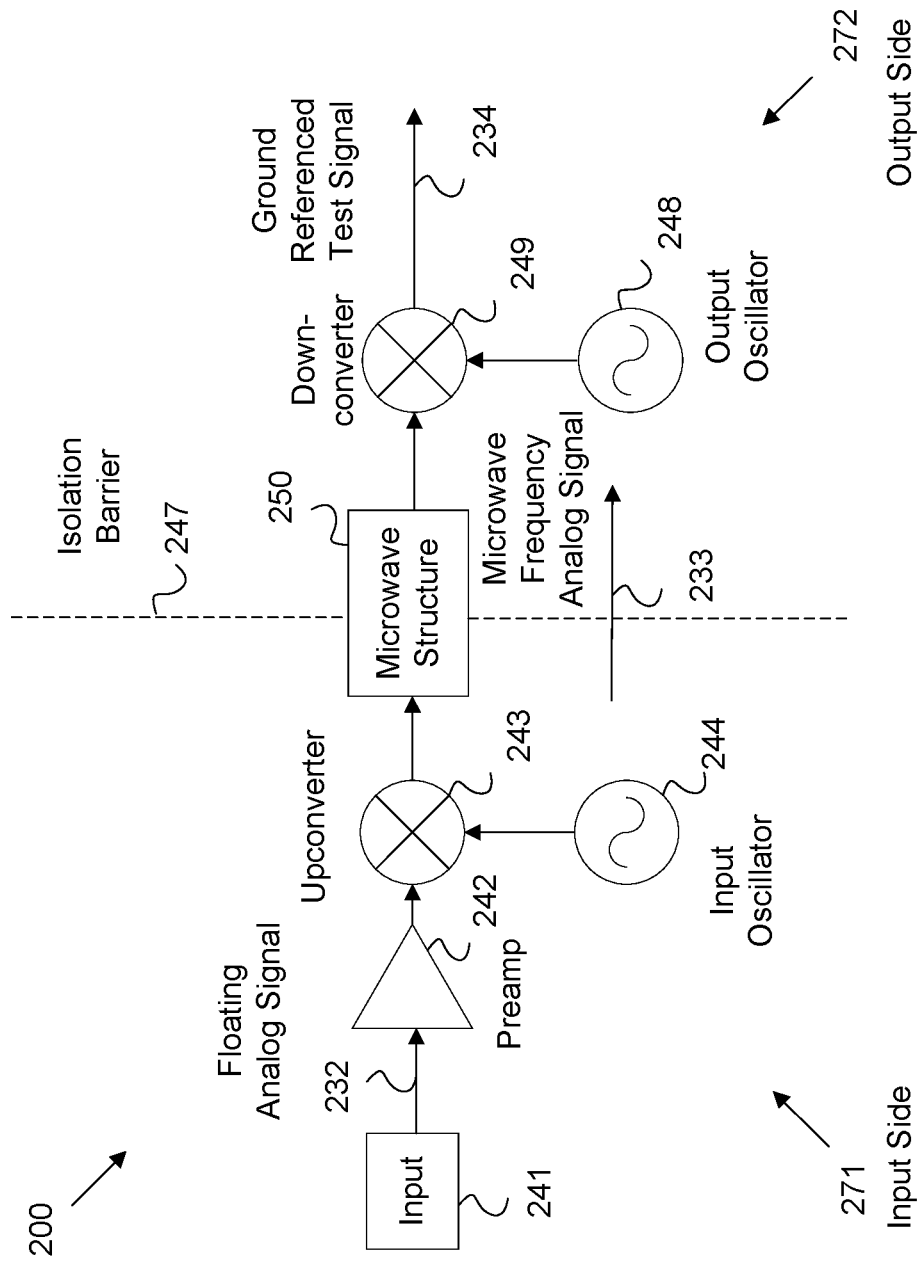
FIG. 2 is a schematic diagram of an example analog isolator.

FIG. 2 is a schematic diagram of an example analog isolator 200, which may be employed to traverse an isolation barrier in a test network, such as test network 100. The analog isolator 200 may be implemented in a signal probe and/or in a test instrument input port. For example, the analog isolator 200 circuitry may fit in a signal probe comp box. The analog isolator 200 includes an input 241, a preamplifier 242, an upconverter 243, an input oscillator 244, a microwave structure 250 positioned across an isolation barrier 247, a downconverter 249, and an output oscillator 248 coupled as shown.

The input 241 is configured to receive a floating analog signal 232 at an input side 271 of the analog isolator 200. The implementation of input 241 may vary based on the implementation of the analog isolator 200. For example, the input 241 may include a probe tip designed to couple to a DUT. As another example, the analog isolator 200 may be an accessory coupled between a probe and an oscilloscope, in which case the input 241 may be a signal probe connector. The floating analog signal 232 may be any test signal that is not coupled to an earth ground for testing purposes. The floating analog signal 232 may be part of a differential signal for which common mode voltage difference is to be rejected during testing, a local chassis ground reference signal, and/or any other signal associated with a floating ground, such as floating ground 121, to be isolated from earth ground by the isolation barrier 247.

The preamplifier 242 may be any amplifier configured to increase or decrease the gain of the floating analog signal 232 so as to optimize the signal amplitude for further processing. The preamplifier 242 may also provide a direct current (DC) offset to the floating analog signal 232 to aid in optimizing the signal amplitude.

The upconverter 243 is coupled to the input 241 via the preamplifier 242. The upconverter 243 is any component configured to increase a frequency of a signal. The upconverter 243 may also be referred to as a mixer/upmixer. The upconverter 243 is designed to modulate the floating analog signal 232 into a microwave frequency analog signal 233. Specifically, the upconverter 243 increases the frequency of the floating analog signal 232. As discussed below, the microwave structure 250 is designed to block low frequency signals while allowing specified frequency signals (e.g. microwave frequency signals) across the isolation barrier. Hence, the upconverter 243 increases the frequency of the floating analog signal 232 to place the signal into a band capable of passing through the microwave structure 250. The upconverter 243 is also coupled to an input oscillator 244. The input oscillator 244 is any device capable of generating periodic oscillating electrical signals. The upconverter 243 employs the electrical signal from the input oscillator 244 to increase the frequency of the floating analog signal 232. For example, the upconverter 243 may multiply the floating analog signal 232 with the electric signal from the input oscillator 244 to obtain the microwave frequency analog signal 233. As a specific example, a floating analog signal 232 of one GHz bandwidth and an input oscillator 244 operating at six GHz may result in a microwave frequency analog signal 233 occupying a range of about five to seven GHz.

The isolation barrier 247 is designed to prevent coupling of the floating analog signal 232 to an earth ground. For example, the isolation barrier 247 may be an area that does not include a conductive path from an input side 271 of the analog isolator 200 (e.g. from the input 241) to an output side 272 of the analog isolator 200. Hence, the isolation barrier 247 isolates the input side 271 from the output side 272 by ensuring that electric charge has no direct conductive path between the input side 271 and the output side 272. The isolation barrier 247 may bisect the microwave structure 250. Also, the isolation barrier 247 may be selected to be less than about one quarter wavelength of the microwave frequency analog signal 233 across the microwave structure 250 for reasons discussed below.

The microwave structure 250 is a circuit designed to transmit the microwave frequency analog signal 233 across the isolation barrier 247 via electromagnetic coupling. The microwave structure 250 includes a transmitting element and a receiving element separated by a gap of nonconductive material. For example, the gap of nonconductive material may be selected as about one quarter of the wavelength or less of the microwave frequency analog signal 233. This allows the microwave frequency analog signal 233 to traverse the isolation barrier 247 while preventing sub-microwave signals from passing across the barrier 247. This allows the signal to cross while maintaining isolation and preventing the floating analog signal 232 from becoming grounded. A sub-microwave signal may be any signal with a frequency below about one GHz (e.g. including direct current and low frequency signals). The microwave structure 250 may act as an analog filter. Hence, the microwave structure 250 may be tuned to allow desired frequency bands across (e.g. selected based on the input oscillator 244, for example five to seven GHz). Further, the upconverter 243 and input oscillator 244 may be tuned to ensure that the microwave frequency analog signal 233 occupies a frequency band that can be passed by the microwave structure 250. For example, the microwave structure 250 may be designed to pass any signal within some range of the microwave band, which may extend from between about one GHz and about one hundred GHz. As such, the upconverter 243 may increase the frequency of the floating analog signal 232 into the microwave band, and the microwave structure 250 may propagate the microwave frequency signal (e.g. microwave frequency analog signal 233) across the isolation barrier 247.

The analog isolator 200 includes a downconverter 249 on the output side 272. The downconverter 249 is coupled to the microwave structure 250 and isolated from the floating analog signal 232 by the isolation barrier 247. The downconverter 249 may also be referred to as a mixer/downmixer. The downconverter 249 is any component configured to decrease a frequency of a signal. The downconverter 249 is configured to demodulate the microwave frequency analog signal 233 to obtain a ground referenced test signal 234 corresponding to the floating analog signal 232. In other words, the downconverter 249 is configured to reduce the frequency to the same extent that the upconverter 243 increases the frequency. This ensures that the analog isolator 200 has a minimized effect on the signal traversing the isolator 200. As such, the ground referenced test signal 234 may be substantially the same signal as the floating analog signal 232, but the input side 271 of the circuit may still be isolated from ground connected to the output side 272 of the circuit. The downconverter 249 may be connected to an output oscillator 248, which may be substantially similar to the input isolator 244. The output oscillator 248 may provide a periodic oscillating signal that is employed (e.g. multiplied, mixed, etc.) by the downconverter 249 to restore the microwave frequency analog signal 233 to a frequency of the floating analog signal 232. It should be noted that the input oscillator 244 may be frequency locked with the output oscillator 248 across the isolation barrier 247. This allows the upconversion to be fully reversible by the downconversion. The frequency lock between the input oscillator 244 and output oscillator 248 may be achieved, for example by a microwave structure similar in design to microwave structure 250, a transformer, a capacitor, and/or an optical isolator.

Figure 3:
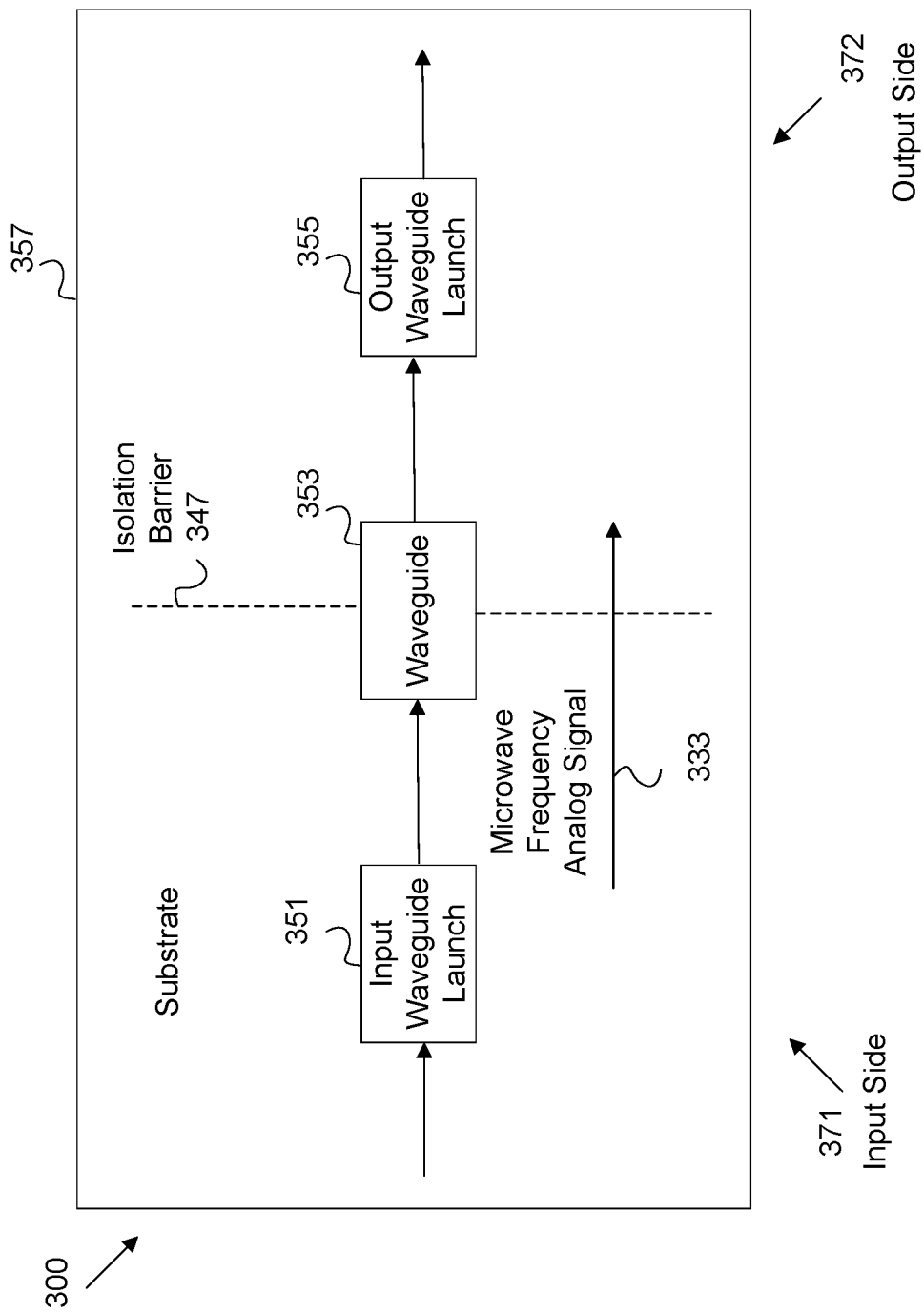
FIG. 3 is a schematic diagram of an example waveguide based microwave structure for an analog isolator.

FIG. 3 is a schematic diagram of an example waveguide based microwave structure 300 for an analog isolator, such as analog isolator 200. For example, waveguide based microwave structure 300 may implement microwave structure 250. Structure 300 is built on a substrate 357. The substrate 357 may be any non-conductive structure to hold circuitry components, such as a Printed Circuit Board (PCB). The substrate 357 includes an input side 371 and an output side 372, which may be substantially similar to input side 271 and output side 272, respectively. The substrate 357 also includes an isolation barrier 347 of non-conductive material positioned between the input side 371 and the output side 372. The isolation barrier 347 may be a subsection of a larger isolation barrier traversing the entire device, such as isolation barrier 247.

The structure 300 may include an input waveguide launch 351 of conductive material extending from the input side 371 of the substrate 357 toward the isolation barrier 347. A waveguide launch, such as input waveguide launch 351, is any component that conductively transitions a signal from a link (e.g. coaxial line) to an electromagnetic wave for entry into a waveguide, such as a waveguide 353. The structure 300 may also include an output waveguide launch 355 of conductive material extending from the output side 372 of the substrate 357 toward the isolation barrier 347. The output waveguide launch 355 may be substantially similar to the input waveguide launch 351, but may conductively transition an electromagnetic wave from the waveguide 353 back to a link. For example, the input waveguide launch 351 and the output waveguide launch 355 may be made of sheet brass. The input waveguide launch 351 receives a microwave frequency analog signal 333 on the input side 371. The microwave frequency analog signal 333 may be substantially similar to microwave frequency analog signal 233. The microwave frequency analog signal 333 may be an upconverted floating signal as discussed above. The microwave frequency analog signal 333 is forwarded across the isolation barrier 347 via the waveguide 353 and forwarded off of the substrate 357 via the output waveguide launch 355 on the output side 372 for downconversion as discussed above.

The structure 300 also includes the waveguide 353. The waveguide 353 is coupled to the input waveguide launch 351 and the output waveguide launch 355. The waveguide 353 is positioned across the isolation barrier 347. The waveguide 353 is structured to provide electro-magnetic coupling between the input waveguide launch 351 and the output waveguide launch 355 at micro-wave frequencies (e.g. one to one hundred GHz). The waveguide 353 is also structured to provide isolation between the input waveguide launch 351 and the output waveguide launch 355 when conducting direct current. The waveguide 353 may employ various structures to provide this functionality. For example, the waveguide 353 may be implemented by employing one or more conductive structures on the input side 371 and one or more corresponding conductive structures on the output side 372. Such conductive structures are separated at the isolation barrier 357 by a gap of non-conductive material and/or a dielectric. Examples of such implementations are discussed with respect to FIGS. 4-7 below. Such a gap may be about one quarter wavelength of the microwave frequency analog signal 333 or less, which allows microwave frequencies to cross the gap while providing isolation for DC signals and hence preventing grounding of floating ground signals.

In another example, the waveguide 353 is made of a dielectric material positioned across the isolation barrier 347, and not made of conductive material. The dielectric is selected to provide total internal reflection at the boundaries of the dielectric to signals at microwave frequencies, and hence constrain any coupled signal within the waveguide. In other words, a dielectric waveguide 353 can propagate the microwave frequency analog signal 333 across the isolation barrier 347 via internal reflection. This approach provides isolation and propagates the signal. Further, this approach may couple the microwave frequency analog signal 333 farther than one quarter wavelength. This may allow the structure 300 to be built with less required precision, and allows for a physically longer isolation break than a gapped conductor based waveguide. For example, in the absence of the conductor, a dielectric waveguide 353 can provide arbitrarily high isolation voltage and arbitrarily low coupling capacitance by making the waveguide 353 arbitrarily long.

FIGS. 4-7, as discussed below, depict various waveguides that may be employed as part of waveguide 353 and/or as part of microwave structure 250. In these examples, solid black represents a conductor (e.g. metal), and a bounded white box represents a dielectric. In such cases, the dielectric represents an isolation barrier. In example layouts 400, 500, and 600, microwave energy travels down an open space between upper and lower conductors, with the conductors serving to reflect microwave energy back into the waveguide that would otherwise spread outside. In the example layout 700, no conductors are employed, but total internal reflection at the dielectric's surfaces serves to guide the microwaves in a similar manner. The relative dimensions shown may be significant in some cases. For example, the open space between the waveguide walls may include a dimension of about $\lambda/2$ to support the wave propagation, whereas the gaps/dielectrics/isolators may include a dimension of less than $\lambda/4$ to minimize energy leakage through the gap. In this context $\lambda$ is the wavelength of the microwave signal to be propagated over the gap/dielectric/isolator. It should be noted that the dielectric waveguide is depicted with a smaller dimension because the wavelength for a specified frequency over a dielectric is shorter than in the wavelength for the same frequency signal in air. Also, the surface of a dielectric may pick up some environmental contamination during manufacture, and is hence likely to withstand less electric field than a solid dielectric. As such, the dielectric placement in each of layouts 400, 500, and 600 allows for a longer isolation distance along the dielectric surface than through the bulk of the dielectric. The gap between the conductors may be small to minimize microwave leakage, but the dielectric may extend beyond the gap to increase the surface isolation distance.

Figure 4:
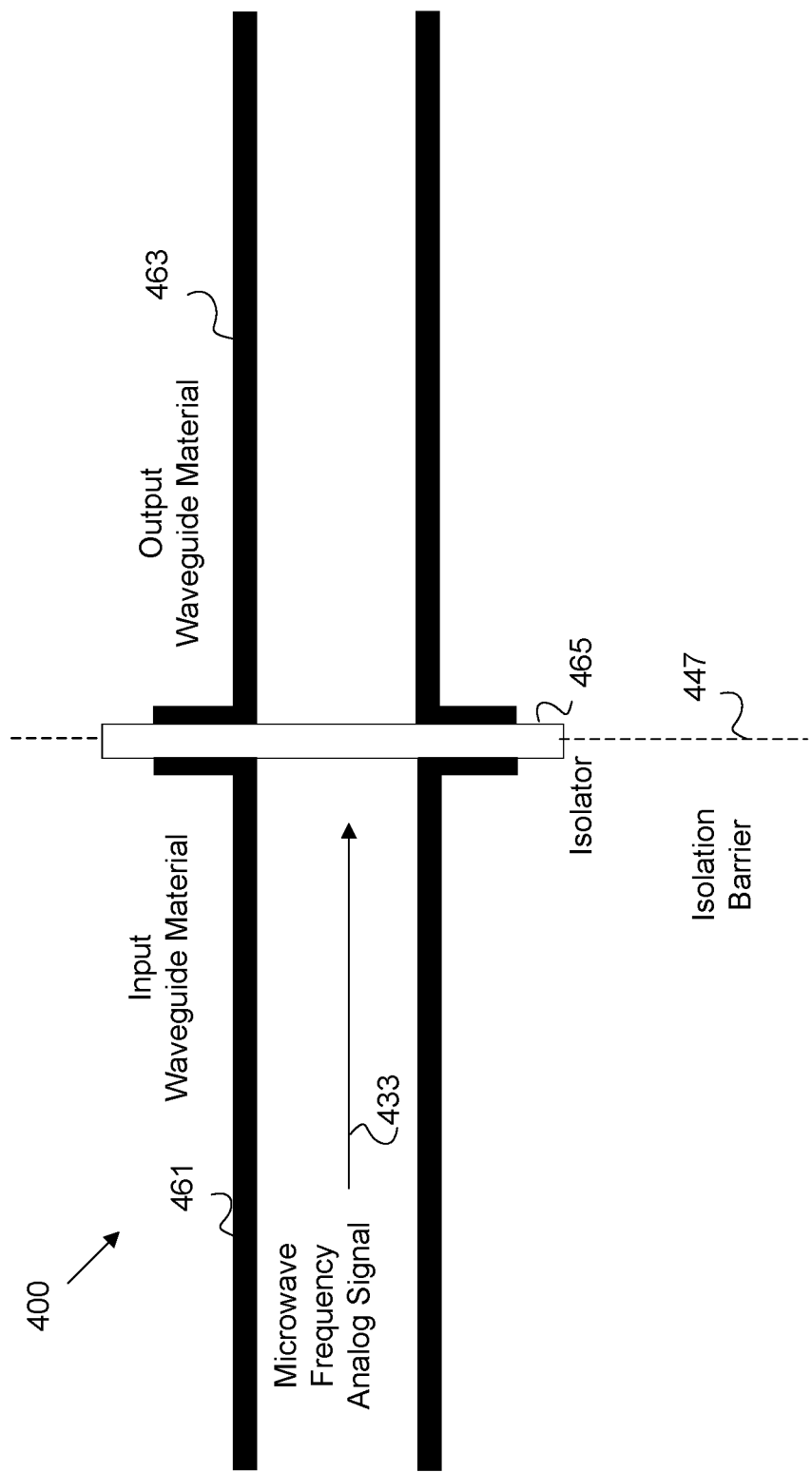
FIG. 4 is a cross section of an example butt gap waveguide layout with a flange for a microwave structure.

FIG. 4 is a cross section of an example butt gap waveguide layout 400 with a flange for a microwave structure, such as microwave structure 250. For example, layout 400 may be employed to construct a waveguide 353. Butt gap waveguide layout 400 is an example waveguide with a gap across an isolation barrier 447. The waveguide layout 400 includes input waveguide material 461 and output waveguide material 463 with a gap at the isolation barrier 447. In layout 400, the input waveguide material 461 and output waveguide material 463 each include a hollow portion (e.g. filled with air) enclosed by metal walls. A signal traversing the waveguide material 461 and/or 463 may traverse the hollow area and bounce off of the walls due to internal reflection.

The gap may be referred to as a butt gap as the ends of the waveguide materials 461 and 463 generally align to butt up to the isolation barrier 447 against each other with a gap in between. This may be substantially similar to isolation barriers 147, 247, and/or 347. The input waveguide material 461 and the output waveguide material 463 may be electromagnetically coupled across the gap at the isolation barrier 447. Hence, a microwave frequency analog signal 433 may traverse the input waveguide material 461 and traverse the isolation barrier via the electromagnetic coupling between the input waveguide material 461 and the output waveguide material 463. The microwave frequency analog signal 433 may be substantially similar to microwave frequency analog signals 233 and/or 333.

The gap is shown in FIG. 4 as an isolator 465. The isolator 465 is any component that prevents direct current flow and hence prevents grounding of a signal on the input side of the layout 400. In some example, the isolator 465 may include an area of PCB without a conductive trace (e.g. without a conductive wall). This may also be referred to as an air gap. In another example, the isolator 465 may include a dielectric material across the isolation barrier 447. Employing a dielectric as an isolator 465 provides a structural component for other components to couple to, and hence provides extra stability as well as isolation. As such, a dielectric included in the isolator 465 may allow for less precise manufacturing processes. A dielectric with a high breakdown voltage, such as KAPTON, may be employed. The approach can provide multiple kilovolts (kVs) of galvanic isolation with gaps on the order of five millimeters. As noted above, the isolator 465 may be less than about one quarter wavelength of the microwave frequency analog signal 433.

Figure 5:
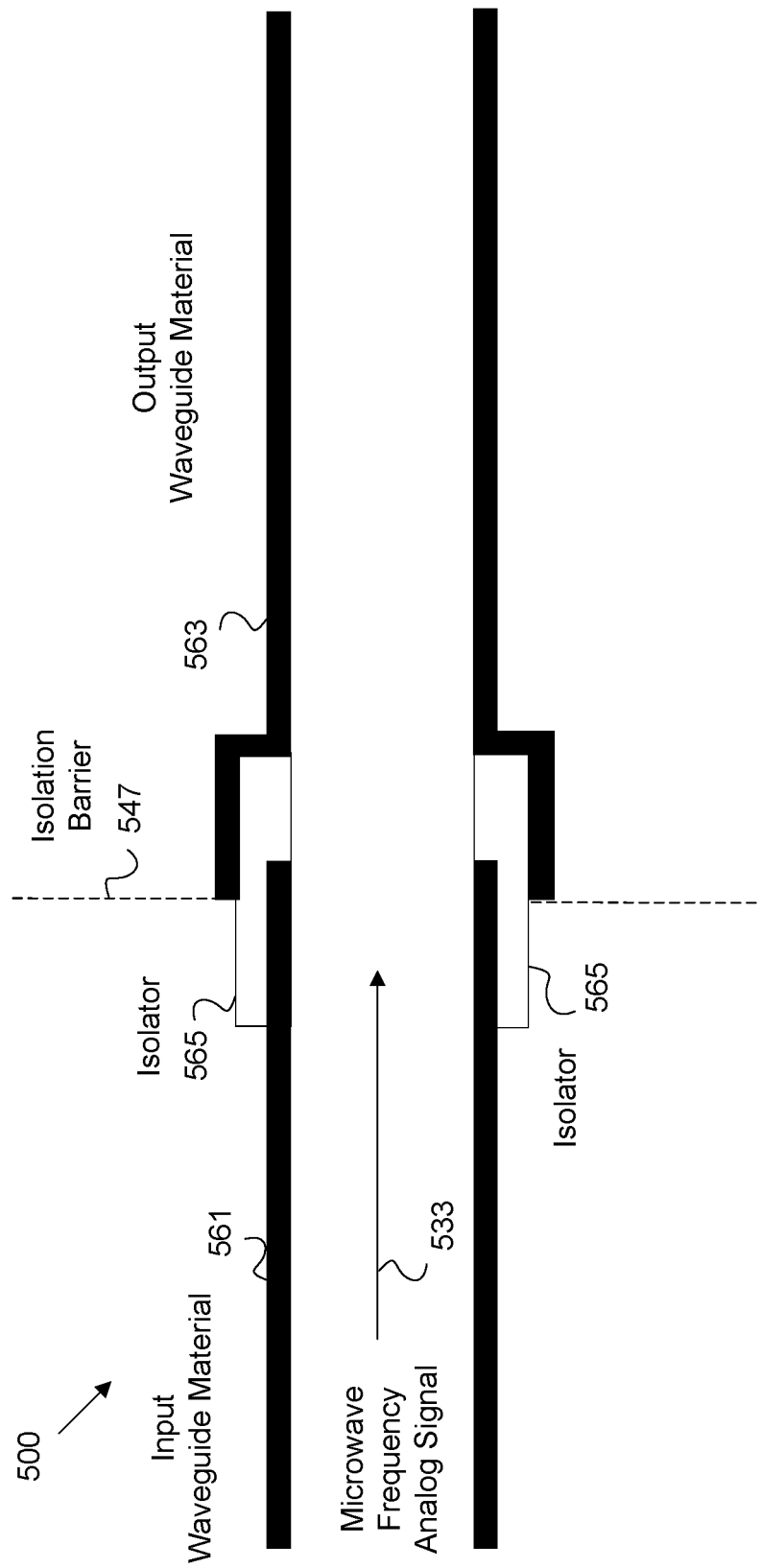
FIG. 5 is a cross section of an example overlap gap waveguide layout for a microwave structure.

FIG. 5 is a cross section of an example overlap gap waveguide layout 500 for a microwave structure, such as microwave structure 250. For example, layout 500 may be employed to construct a waveguide 353 in a manner similar to layout 400. Layout 500 includes input waveguide material 561, output waveguide material 563, an isolation barrier 547, and an isolator 565, which may be substantially similar to the input waveguide material 461, the output waveguide material 463, the isolation barrier 447, and the isolator 465, respectively. A microwave frequency analog signal 533, which may be substantially similar to the microwave frequency analog signal 433 travels through the layout 500. However, the waveguide layout 500 includes waveguide material 561 and 563 with an overlap gap at the isolation barrier 547. The input waveguide material 561 and output waveguide material 563 may extend to the isolation barrier 547. In some examples, the input waveguide material 561 and output waveguide material 563 may even extend over the isolation barrier 547. However, the isolator 565 maintains the isolation barrier 547, even when such overlap occurs. The overlap gap waveguide layout 500 shown may have certain beneficial properties when performing electromagnetic coupling. For example, electromagnetic coupling in an overlap gap configuration may result in very little signal leakage due to the physical structure of the conductive material. As with layout 400, the input waveguide material 561 and output waveguide material 563 each include a hollow portion (e.g. filled with air) enclosed by metal walls. A signal traversing the waveguide material 561 and/or 563 may traverse the hollow area and bounce off of the walls due to internal reflection, in this case without traversing the isolator 565.

Figure 6:
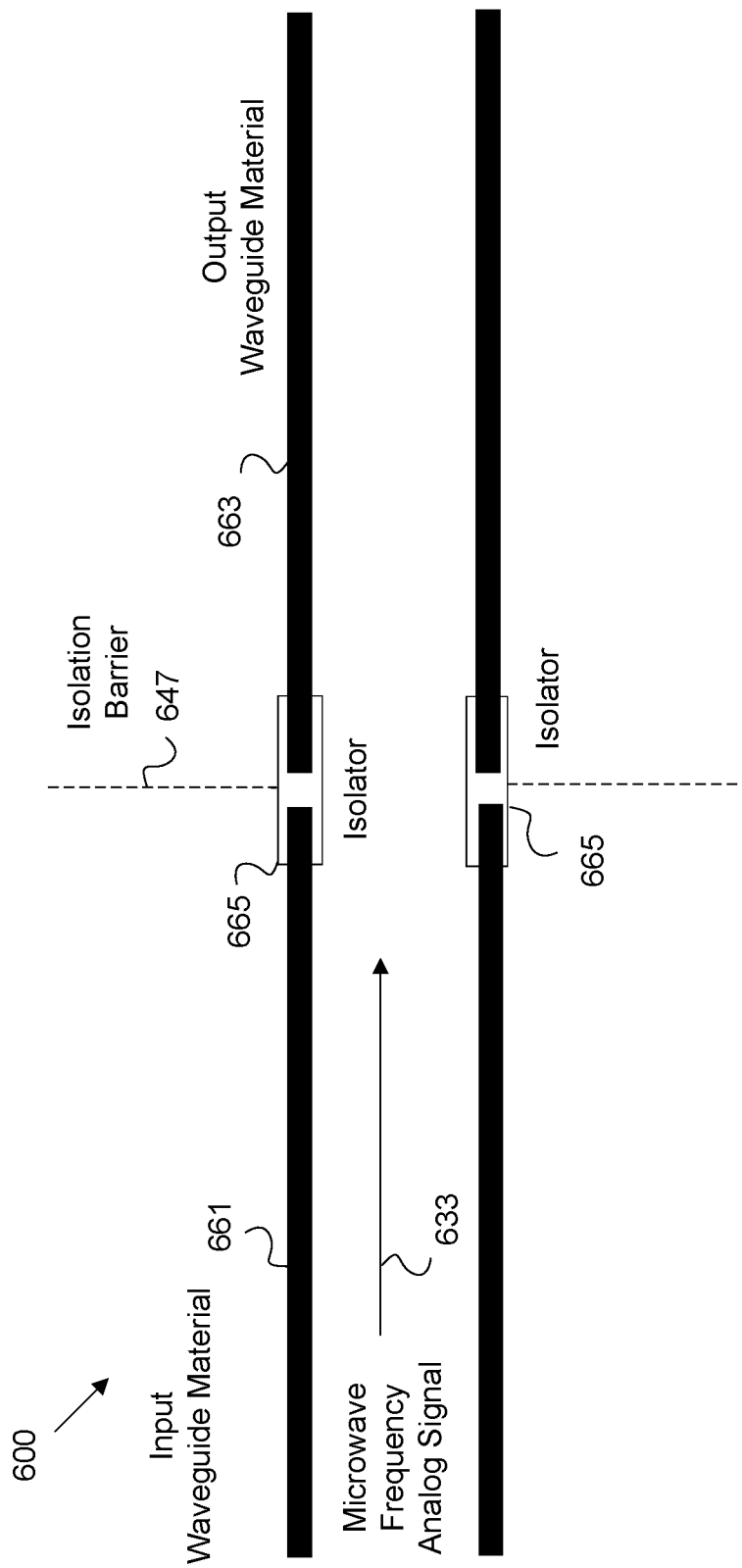
FIG. 6 is a cross section of an example butt gap waveguide layout without a flange for a microwave structure.

FIG. 6 is a cross section of an example butt gap waveguide layout 600 without a flange for a microwave structure, such as microwave structure 250. For example, layout 600 may be employed to construct a waveguide 353 in a manner similar to layouts 400 and 500. Layout 600 includes input waveguide material 661, output waveguide material 663, an isolation barrier 647, and isolator 665, which may be substantially similar to the input waveguide material 461, output waveguide material 463, isolation barrier 447, and isolator 465, respectively. A microwave frequency analog signal 633, which may be substantially similar to the microwave frequency analog signal 433 travels through the layout 600. Unlike layout 400, layout 600 employs an isolator 665 between the input waveguide material 661 and the output waveguide material 663. In layout 400, the input waveguide material 661 and output waveguide material 663 each include a hollow portion (e.g. filled with air) enclosed by metal walls. In this case, the hollow portion extends across the isolation barrier 647. As such, the microwave frequency analog signal 633 traverses the hollow portion without traversing the isolator 665.

Figure 7:
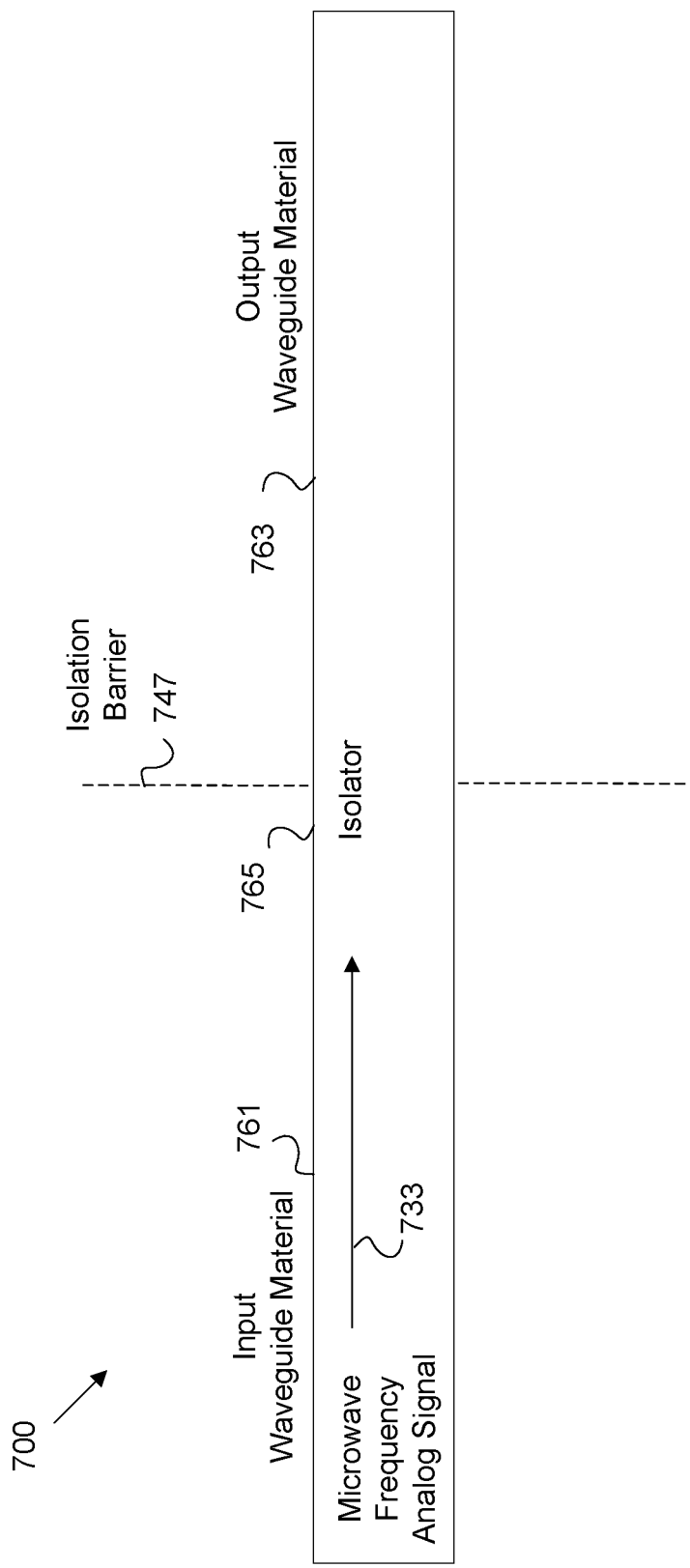
FIG. 7 is a cross section of an example dielectric waveguide layout for a microwave structure.

FIG. 7 is a cross section of an example dielectric waveguide layout 700 for a microwave structure, such as microwave structure 250. For example, layout 700 may be employed to construct a waveguide 353 in a manner similar to layouts 400, 500, and 600. Layout 700 includes an isolator 765 that traverses an isolation barrier 747. In this case, an input waveguide material 761 and an output waveguide material 763 include the isolator 765. An microwave frequency analog signal 733 may traverse the isolator 765. The isolator 765 includes non-conductive material and includes a length selected to allow the microwave frequency analog signal 733 to extend across the isolator 765 while preventing sub-microwave frequency signals from crossing.

Figure 8A:
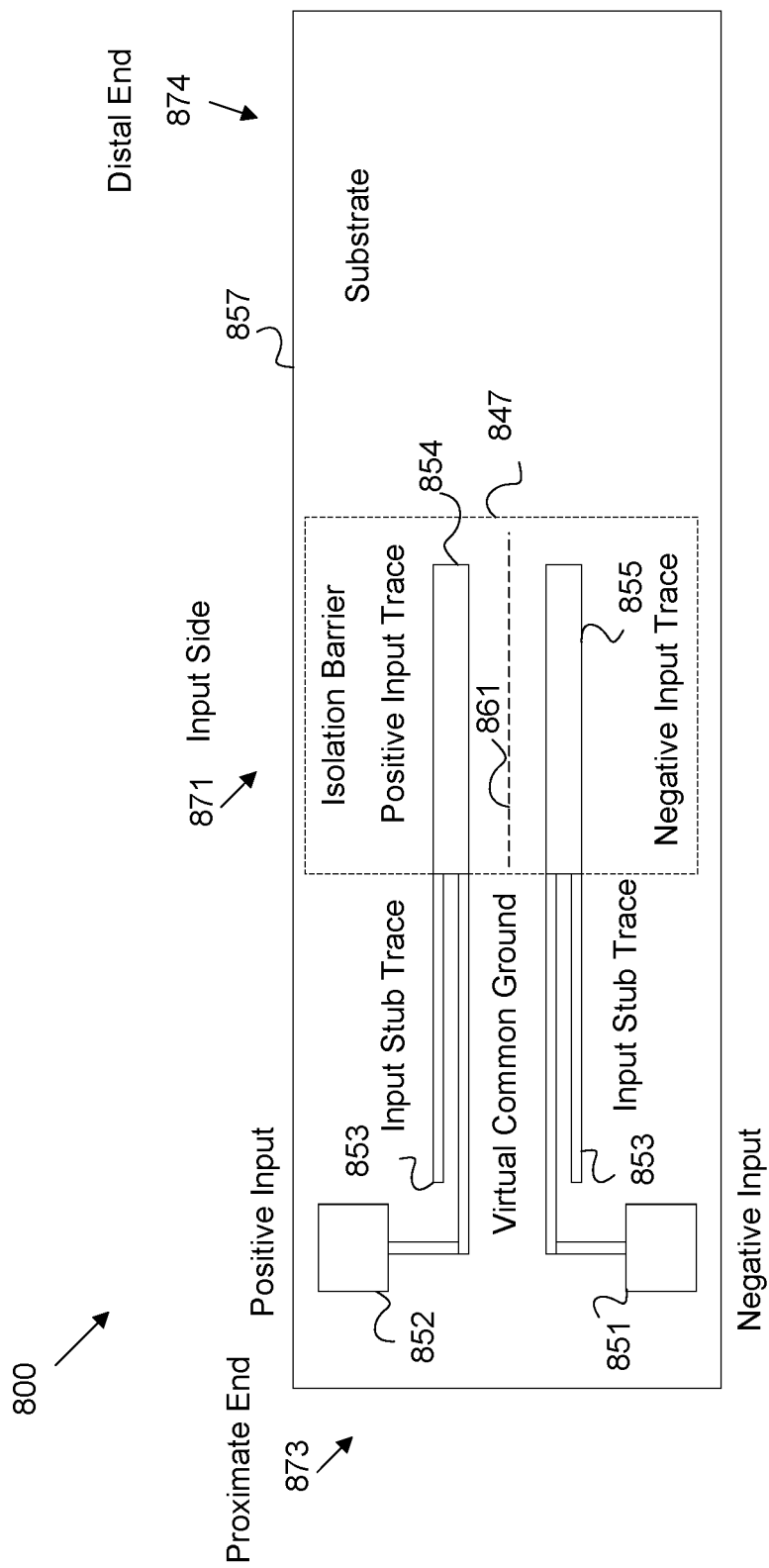
FIGS. 8A-8C are schematic diagrams of an example coupled line based microwave structure for an analog isolator.
Figure 8B:
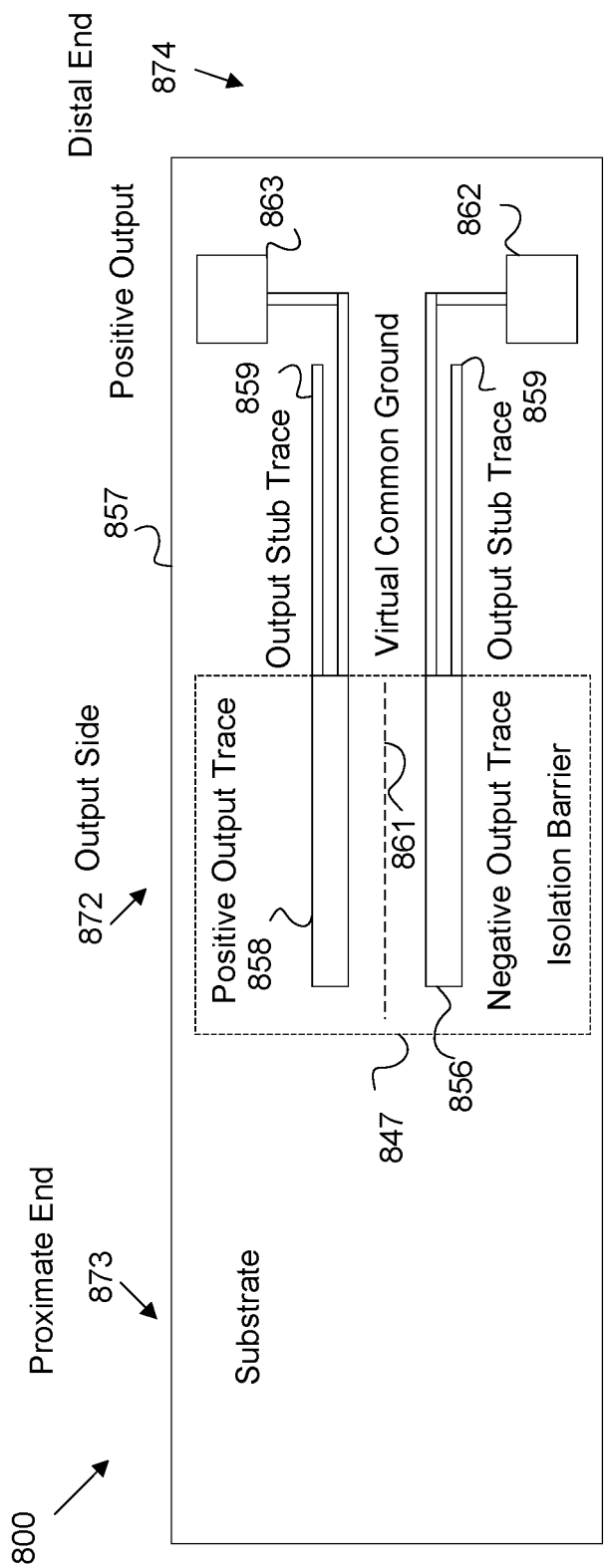
Figure 8C:
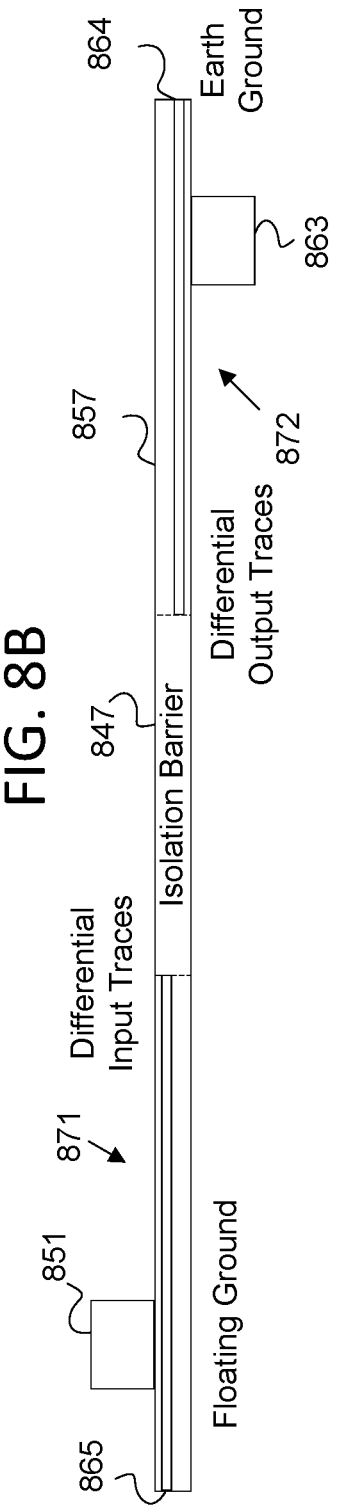

FIGS. 8A-8C are schematic diagrams of an example coupled line based microwave structure 800 for an analog isolator, such as analog isolator 200. For example, the coupled line based microwave structure 800 may implement microwave structure 250. FIGS. 8A, 8B, and 8C illustrate a top view, a bottom view, and a cross sectional view, respectively, of the coupled line based microwave structure 800. The structure 800 is built on a substrate 857, such as a PCB. For purposes of discussion, the substrate 857 includes an input side 871 as shown in FIG. 8A and an output side 872 as shown in FIG. 8B. The substrate 857 also includes a proximate end 873 and a distal end 874. The coupled line based microwave structure 800 illustrates an example microwave structure that includes an input conductor on an input side of an isolation barrier, the input conductor implemented as differential input traces. The structure 800 also includes an output conductor on an output side of the isolation barrier implemented as differential output traces. The input conductor and the output conductor are then electromagnetically coupled across the isolation barrier. Reference is first made to the input side 871 as shown in FIG. 8A.

Structure 800 is implemented as a differential system. In a differential system, a propagated signal value is represented as a difference between a pair of signal values. Hence, the structure 800 includes a pair of differential input traces extending from the proximate end 873 of the input side 871 of the substrate 857. The pair of differential input traces includes a positive input trace 854 and a negative input trace 855. The positive input trace 854 is coupled to a positive input 852 and the negative input trace 855 is coupled to a negative input 851, respectively. For example, the positive input 852 may receive a positive floating analog signal from a positive output of an upconverter. Likewise, the negative input 851 may receive a negative floating analog signal from a negative output of an upconverter.

The positive input trace 854 and the negative input trace 855 include conductive material and extend from the proximate end 873 toward an isolation barrier 847, which may be substantially similar to isolation barrier 247. As such, the positive input trace 854 conducts a positive floating analog signal and the negative input trace 855 conducts a negative floating analog signal, respectively. Referring to FIG. 8C, the isolation barrier 847 includes non-conductive material (e.g. PCB material). The isolation barrier 847 is included in the substrate 857 and extends between the input side 871 and the output side 872. The positive input trace 854 and negative input trace 855 are applied to the input side 871 of the substrate 857 over the isolation barrier 847. Referring back to FIG. 8A, the positive input trace 854 and negative input trace 855 carry complementary and opposite signals. As such, the voltage induced between the positive input trace 854 and the negative input trace 855 cancels out in an area between the traces. This results in an area of zero voltage, which acts as a virtual common ground 861 for differential signals. The virtual common ground 861 acts as a ground from an electrical standpoint, but is not conductive and hence does not act as a ground connection relative to the isolation barrier 847 for direct current voltages.

Referring now to FIG. 8B, the output side 872 substantially mirrors the input side 871. The structure 800 includes a pair of differential output traces extending from the distal end 874 of the output side 872 of the substrate 857. The differential output traces include a positive output trace 858 to conduct a positive ground referenced test signal corresponding to the positive floating analog signal. The differential output traces also include a negative output trace 856 to conduct a negative ground referenced test signal corresponding to the negative floating analog signal. The positive output trace 858 is coupled to a positive output 863 and the negative output trace 856 is coupled to a negative output 862, respectively. For example, the positive output 863 may output a positive floating analog signal to a positive input of a downconverter. Likewise, the negative output 862 may output a negative floating analog signal to a negative input of a downconverter. As noted above, the isolation barrier 847 is positioned between the differential input traces and the differential output traces. The differential input traces and the differential output traces electromagnetically couple across the isolation barrier at micro-wave frequencies. For example, the positive input trace 854 transmits the positive floating analog signal across the isolation barrier 847 for receipt at the positive output trace 858 as a positive ground referenced test signal. Likewise, the negative input trace 855 transmits the negative floating analog signal across the isolation barrier 847 for receipt at the negative output trace 856 as a negative ground referenced test signal. However, the isolation barrier 847 is non-conductive. As such, the isolation barrier 847 provides isolation of the differential input traces from the differential output traces against conducting direct current. Accordingly, the isolation barrier 847 prevents the floating analog signals on the input side from becoming grounded, while allowing microwave frequency signals to cross (e.g. after upconversion as discussed with respect to FIG. 2). Further, the positive output trace 858 and the negative output trace 856 are positioned to create a virtual ground 861 in the same manner as the input traces. As such, the differential input traces and differential output traces are positioned to create a virtual common ground 861 plane for the differential microwave analog signals and a virtual open for the common-mode signal from the floating input. In other words, the input conductor includes a pair of differential conductors sharing a virtual ground, and the output conductor includes a pair of differential conductors sharing the same virtual ground. Thus positive input trace 854 and positive output trace 858 form a coupled transmission line bandpass filter over the common virtual ground, and may be tuned to couple the microwave analog signal across the isolation barrier. Similarly, negative input trace 855 and negative output trace 856 form a coupled transmission line bandpass filter over the common virtual ground, and may be similarly tuned to couple the microwave analog signal across the isolation barrier.

Referring to FIG. 8C, the substrate 857 contains a conductive layer acting as a floating ground 865 on the proximate end. The substrate 857 also includes a conductive layer acting as an earth ground 864 on the distal end. The floating ground 865 and the earth ground 864 are separated by the isolation barrier 847 to maintain isolation between the input side 871 and the output side 872. Grounds 865 and 864 are employed by various components to complete the conductive circuits. For example, a completed circuit from an upconverter 243 may require a path to a floating ground, while a completed circuit from a downconverter 249 may require a path to an earth ground. Floating ground 865 and earth ground 864 may provide such ground paths. Input stub traces 853, as shown in FIG. 8A, may provide a connection to the floating ground 865 from the differential input traces. Also, output stub traces 859, as shown in FIG. 8B, may provide a connection to earth ground 864 from the differential output traces. The stub traces 853 and 859 may be made of conductive material. Further, the stub traces 853 and 859 may be sized at a quarter wavelength in length between the isolation barrier 847 and a point where the corresponding stub trace connects through a substrate layer to a corresponding ground 865 and 864, respectively. The differential input traces and differential output traces include quarter wavelength stub traces 853 and 859 to provide impedance matching at carrier frequencies and local ground shorts outside of carrier frequencies. For example, quarter-wave stubs may provide high impedance at the carrier frequency, but may drop in impedance as the frequency deviates from the carrier and may become shorts at DC or twice the carrier frequency. The coupled-line bandpass filter, however, may provide increased impedance as the frequency deviates from the carrier, and may become open at DC or twice the carrier frequency. The two impedance shifts work to partially cancel each other, allowing a better impedance match over a wider bandwidth.

As a specific example, at an impedance of fifty Ohms per side, with differential impedance of about one hundred Ohms for both sides, each coupled line pair may have an even-mode impedance that is one hundred Ohms greater than its odd-mode impedance, both taken with respect to the virtual ground plane extending across the virtual common ground 861. The stub traces 853 and 859 may act as a filter for the microwave frequency signals traversing the isolation barrier 847. For example, the stub traces 853 and 859, when sized to about a quarter wavelength, may increase the size of the microwave frequency band that can traverse the isolation barrier. Hence, the stub traces 853 and 859 may act as a wideband filter, and may increase the effective microwave frequency range of the isolator. In other words, the microwave structure 800 includes a stub 853 operating as a DC path for the upconverter and as an impedance matching filter for a microwave frequency analog signal. Also, the microwave structure 800 includes a stub 859 operating as a DC path for the downconverter and as an impedance matching filter for the microwave frequency analog signal. It should be noted that, in some examples, the stub traces 853 and 859 may be omitted in favor of a dual of the abovementioned differential input traces and differential output traces with unconnected ends of the coupled lines shorted to ground. Such a configuration may function in a similar manner, but may be difficult to implement due to geometric constraints.

Figure 9:
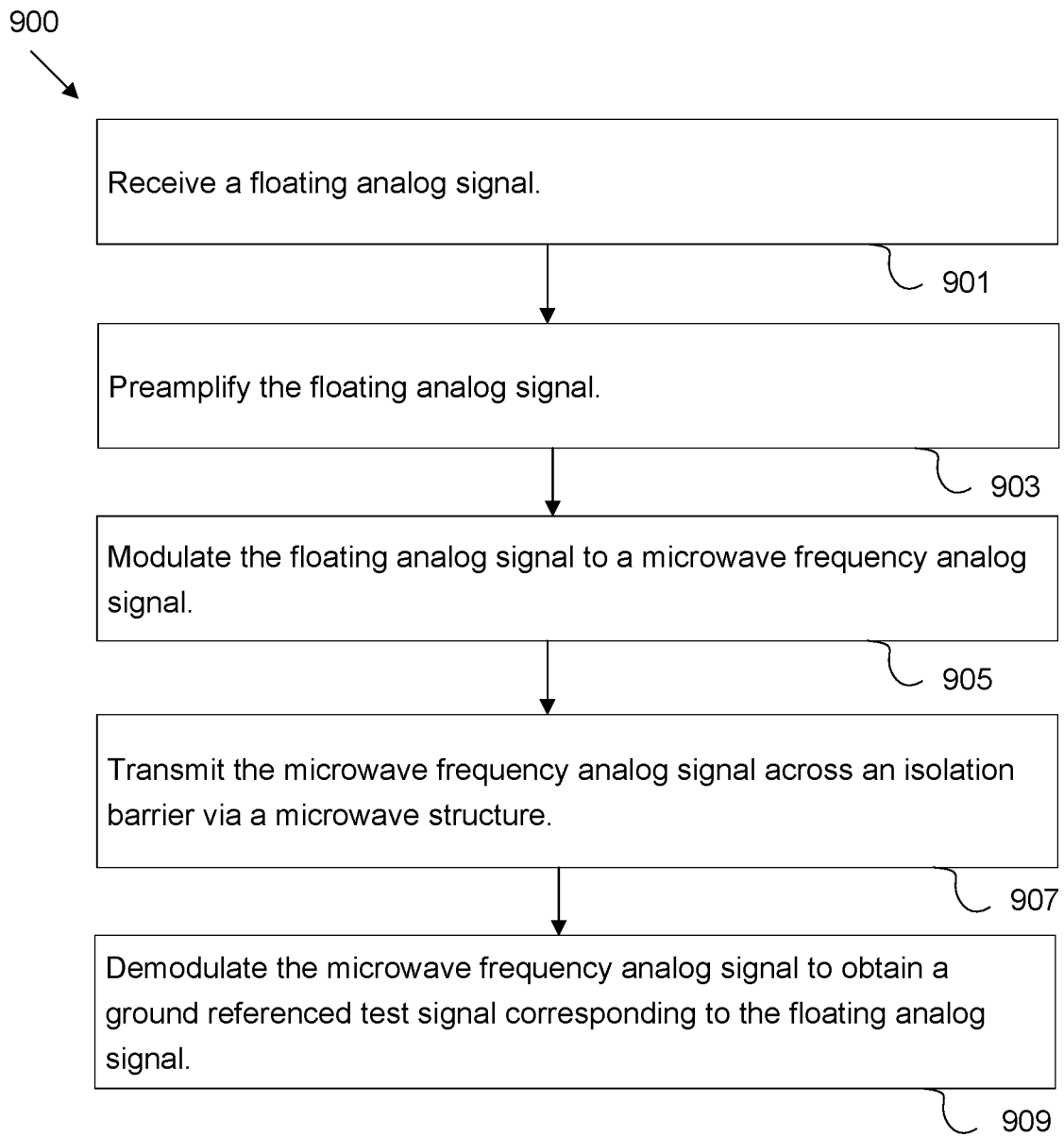
FIG. 9 is a flowchart of an example method of transmitting a signal over an analog isolator via electromagnetic coupling.

FIG. 9 is a flowchart of an example method 900 of transmitting a signal over an analog isolator via electromagnetic coupling. For example, method 900 may be implemented in an analog isolator 200 operating in a test network 100. Method 900 may operate on a microwave structure 300 employing any of waveguide layouts 400, 500, 600, 700. Method 900 may also operate on a coupled line based microwave structure 800. At block 901, a floating analog signal is received at an input, such as input 241. The floating analog signal is then preamplified at block 903 by a preamplifier. The floating analog signal is amplified in order to optimize the signal amplitude for the dynamic range of subsequent circuitry, such as an upconverter and/or downconverter. At block 905, the floating analog signal is modulated into a microwave frequency analog signal. For example, an upconverter 243 may increase a frequency of the floating analog signal by mixing/convolving the floating analog signal with an oscillating signal from an input oscillator. At block 907, the microwave frequency analog signal is transmitted across an isolation barrier via a microwave structure, such as microwave structure 300 and/or 800. At block 909, the microwave frequency analog signal may be demodulated to obtain a ground referenced test signal corresponding to the floating analog signal. For example, a downconverter 249 may decrease the frequency of the microwave frequency analog signal by mixing/convolving the microwave frequency analog signal with an oscillating signal from an output oscillator 248. This results in a ground referenced test signal that is substantially similar to, and corresponds to, a floating analog signal while maintaining an isolation barrier preventing grounding between devices.

Figure 10:
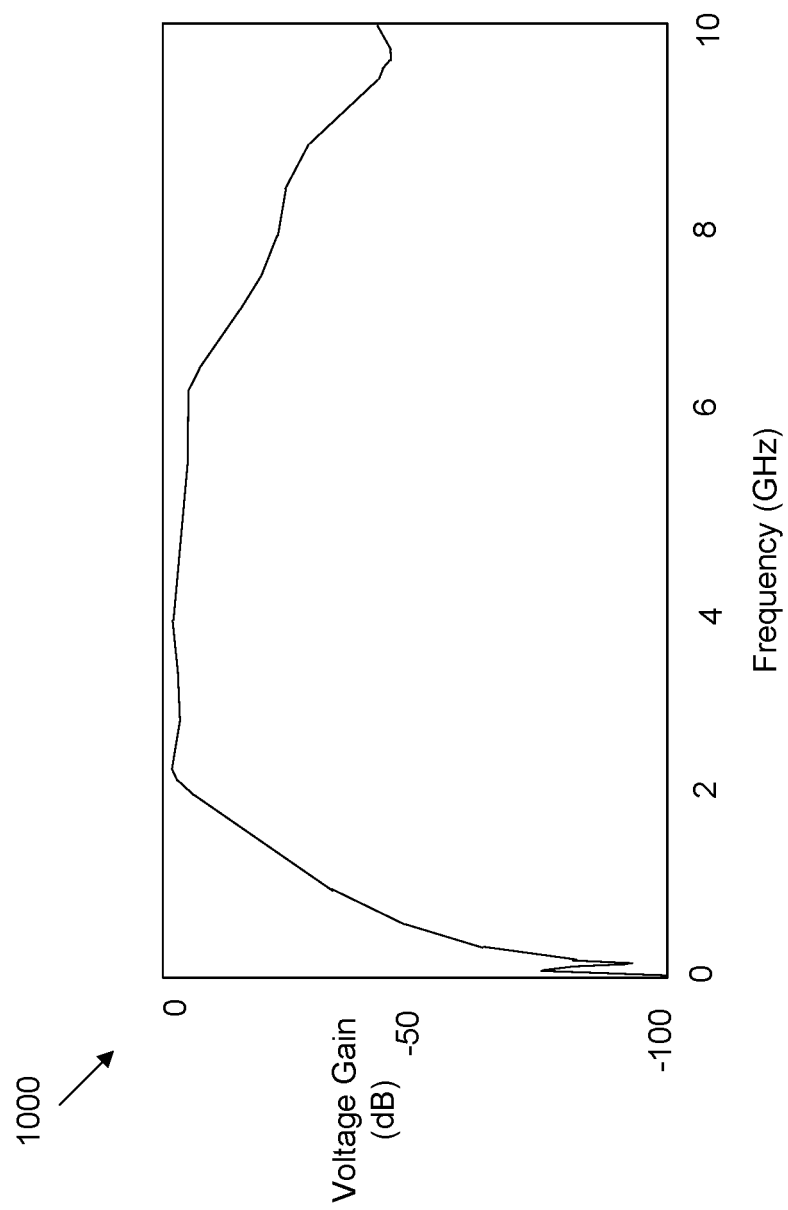
FIG. 10 is a graph of an example signal coupling over an analog isolator as a function of frequency.

FIG. 10 is a graph 1000 of an example signal coupling over an analog isolator, such as an analog isolator 200, as a function of frequency. Graph 1000 depicts voltage gain at the isolation barrier in units of decibels (dB) versus signal frequency in units of gigahertz (GHz). As shown, below about one GHz there is very little transmission. As the frequency increases into the microwave range (e.g. above one GHz), the gain approaches 0 dB or full transmission. For the example shown, the majority of power is transmitted across the barrier between about two GHz and about six GHz. This supports two GHz of modulation on either side of a four GHz midpoint. However, it should be noted that tuning (e.g. adjusting the physical dimensions of the circuit configuration) may alter the frequency band that is allowed to pass the isolation filter. The various analog isolators discussed herein may operate in substantially any portion of the microwave frequency range.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes an apparatus comprising: an input to receive a floating analog signal; an upconverter, coupled to the input, the upconverter to modulate the floating analog signal to a microwave frequency analog signal; an isolation barrier to prevent coupling of the floating analog signal to an earth ground; and a microwave structure to transmit the microwave frequency analog signal across the isolation barrier via electromagnetic coupling.

Example 2 includes the apparatus of Example 1, further comprising a downconverter coupled to the microwave structure and isolated from the floating analog signal by the isolation barrier, the downconverter to demodulate the microwave frequency analog signal to obtain a ground referenced test signal corresponding to the floating analog signal.

Example 3 includes the apparatus of Example 2, wherein the microwave structure couples a majority of the microwave frequency analog signal from the upconverter to the downconverter.

Example 4 includes the apparatus of Examples 1-3, wherein the microwave structure includes a waveguide with a gap across the isolation barrier.

Example 5 includes the apparatus of Example 4, wherein the gap across the isolation barrier includes a dielectric material.

Example 6 includes the apparatus of Examples 1-5, wherein the microwave structure includes a dielectric waveguide to propagate the microwave frequency analog signal across the isolation barrier via internal reflection.

Example 7 includes the apparatus of Examples 1-6, wherein the microwave structure includes an input conductor on an input side of the isolation barrier and an output conductor on an output side of the isolation barrier, the input conductor and the output conductor electromagnetically coupled across the isolation barrier.

Example 8 includes the apparatus of Example 7, wherein the input conductor includes a pair of differential conductors sharing a virtual ground, and the output conductor includes a pair of differential conductors sharing a virtual ground.

Example 9 includes the apparatus of Examples 6-8, wherein the microwave structure includes a stub operating as a DC path for the upconverter and as an impedance matching filter for the microwave frequency analog signal.

Example 10 includes the apparatus of Examples 1-9, wherein isolation barrier bisects the microwave structure, and the isolation barrier is less than one quarter wavelength of the microwave frequency analog signal.

Example 11 includes an apparatus comprising: a substrate including an input side, an output side, a proximate end, and a distal end; a pair of differential input traces extending from the proximate end of the input side of the substrate; a pair of differential output traces extending from the distal end of the output side of the substrate; an isolation barrier of non-conductive material included in the substrate, the isolation barrier positioned between the differential input traces and the differential output traces for electro-magnetic coupling between the differential input traces and the differential output traces at micro-wave frequencies and isolation of the differential input traces from the differential output at sub-microwave frequencies.

Example 12 includes the apparatus of Example 11, wherein the differential input traces include: a positive input trace to conduct a positive floating analog signal; and a negative input trace to conduct a negative floating analog signal.

Example 13 includes the apparatus of Examples 11-12, wherein the differential output traces include: a positive output trace to conduct a positive ground referenced test signal corresponding to the positive floating analog signal; and a negative output trace to conduct a negative ground referenced test signal corresponding to the negative floating analog signal.

Example 14 includes the apparatus of Examples 11-13, wherein the differential input traces and differential output traces are positioned to create a virtual common ground plane for differential signals and a virtual common open for common-mode signals.

Example 15 includes the apparatus of Examples 11-14, wherein the differential input traces include quarter wavelength stub traces providing impedance matching at microwave frequencies and local bias current paths.

Example 16 includes an apparatus comprising: a substrate including an input side and an output side; an isolation barrier of non-conductive material positioned between the input side and the output side; an input waveguide launch of conductive material extending from the input side toward the isolation barrier; an output waveguide launch of conductive material extending from the output side toward the isolation barrier; and a waveguide coupled to the input waveguide launch and output waveguide launch, the waveguide positioned across the isolation barrier for electromagnetic coupling between the input waveguide launch and the output waveguide launch at micro-wave frequencies and isolation between the input waveguide launch and the output waveguide launch at sub-microwave frequencies.

Example 17 includes the apparatus of Example 16, wherein the waveguide includes a dielectric to constrain coupled signals within the waveguide due to total internal reflection at boundaries of the dielectric.

Example 18 includes the apparatus of Example 16, wherein the waveguide includes waveguide material with an overlap gap at the isolation barrier.

Example 19 includes the apparatus of Example 16, wherein the waveguide includes waveguide material with a butt gap at the isolation barrier.

Example 20 includes the apparatus of Examples 16-19, wherein the waveguide includes waveguide material with a gap at the isolation barrier, the gap including a dielectric.

Example 21 includes a method comprising: receiving a floating analog signal; modulating the floating analog signal into a microwave frequency analog signal; and transmitting the microwave frequency analog signal across an isolation barrier in a test and measurement system via a microwave structure.

Example 22 includes the method of Example 21, further comprising preamplifying the floating analog signal prior to modulating the floating analog signal.

Example 23 includes the method of Example 21, further comprising demodulating the microwave frequency analog signal to obtain a ground referenced test signal corresponding to the floating analog signal.

Example 24 includes the method of Example 23, wherein the floating analog signal is modulated into the microwave frequency analog signal by convolving the floating analog signal with an oscillating signal from an input oscillator, wherein the microwave frequency analog signal is demodulated by convolving the microwave frequency analog signal with an oscillating signal from an output oscillator, and wherein the output oscillator is frequency locked to the input oscillator.

Example 25 includes the method of Examples 21-24, wherein the isolation barrier bisects the microwave structure, and the isolation barrier is less than one quarter wavelength of the microwave frequency analog signal.

Example 26 includes the method of Examples 21-25, wherein the isolation barrier bisects the microwave structure, and the microwave frequency analog signal is constrained in the microwave structure while traversing the isolation barrier due to total internal reflection of the microwave structure.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:
1. An apparatus comprising:
a substrate including an input side and an output side;
an isolation barrier of non-conductive material positioned between the input side and the output side;
an input waveguide launch of conductive material extending from the input side toward the isolation barrier;
an output waveguide launch of conductive material extending from the output side toward the isolation barrier;
a waveguide coupled to the input waveguide launch and output waveguide launch, the waveguide positioned across the isolation barrier for electromagnetic coupling between the input waveguide launch and the output waveguide launch at microwave frequencies and isolation between the input waveguide launch and the output waveguide launch at sub-microwave frequencies;
an input for receiving a floating analog signal; and an upconverter coupled between the input and the input waveguide launch, the upconverter to modulate the floating analog signal to a microwave frequency analog signal.

2. The apparatus of claim 1, wherein the waveguide electromagnetically couples a microwave frequency signal across the isolation barrier, and the waveguide includes a dielectric to constrain the microwave frequency signal within the waveguide due to total internal reflection at boundaries of the dielectric.

3. The apparatus of claim 2, wherein the isolation barrier is greater than one quarter wavelength of the microwave frequency signal.

4. The apparatus of claim 1, wherein the waveguide includes waveguide material with an overlap gap at the isolation barrier.

5. The apparatus of claim 1, wherein the waveguide includes waveguide material with a butt gap at the isolation barrier.

6. The apparatus of claim 1, wherein the waveguide includes waveguide material with a gap at the isolation barrier, the gap including a dielectric.

7. The apparatus of claim 1, further comprising:
a downconverter coupled to the output waveguide launch and isolated from the floating analog signal by the isolation barrier, the downconverter to demodulate the microwave frequency analog signal to obtain a ground referenced test signal corresponding to the floating analog signal.

8. The apparatus of claim 7, wherein the waveguide couples a majority of the microwave frequency analog signal from the upconverter to the downconverter.

9. The apparatus of claim 1, further comprising an amplifier coupled between the input and the upconverter.

10. The apparatus of claim 1, wherein the waveguide comprises a dielectric waveguide to propagate the microwave frequency analog signal across the isolation barrier via internal reflection.

11. The apparatus of claim 10, wherein a length of the waveguide is selected to provide a desired isolation voltage level.

12. The apparatus of claim 11, wherein the isolation barrier is greater than one quarter wavelength of the microwave frequency analog signal.

13. A method comprising:
receiving a floating analog signal;
amplifying the floating analog signal;
modulating the amplified floating analog signal into a microwave frequency analog signal; and
transmitting the microwave frequency analog signal across an isolation barrier through a waveguide, the waveguide positioned across the isolation barrier for electromagnetic coupling between an input side and an output side at microwave frequencies and isolation between the input side and the output side at sub-microwave frequencies.

14. The method of claim 13, further comprising demodulating the microwave frequency analog signal to obtain a ground referenced test signal corresponding to the floating analog signal.

15. The method of claim 14, wherein
the floating analog signal is modulated into the microwave frequency analog signal by convolving the floating analog signal with an oscillating signal from an input oscillator;
the microwave frequency analog signal is demodulated by convolving the microwave frequency analog signal with an oscillating signal from an output oscillator; and
the output oscillator is frequency locked to the input oscillator.

16. The method of claim 13, wherein the isolation barrier bisects the waveguide, and the isolation barrier is less than one quarter wavelength of the microwave frequency analog signal.

17. The method of claim 13, wherein the waveguide comprises a dielectric waveguide positioned across the isolation barrier, and the microwave frequency analog signal is propagated across the isolation barrier via internal reflection.

18. The method of claim 17, wherein the isolation barrier is greater than one quarter wavelength of the microwave frequency analog signal.

19. A test network comprising:
an isolated signal probe including
an input for receiving a floating signal from a device under test,
an output,
a substrate including an input side and an output side,
an isolation barrier of non-conductive material positioned between the input side and the output side,
an input waveguide launch of conductive material extending from the input side toward the isolation barrier,
an output waveguide launch of conductive material extending from the output side toward the isolation barrier, and
a waveguide coupled to the input waveguide launch and output waveguide launch, the waveguide positioned across the isolation barrier for electromagnetic coupling between the input waveguide launch and the output waveguide launch at microwave frequencies and isolation between the input waveguide launch and the output waveguide launch at sub-microwave frequencies,
wherein the input is coupled to the input waveguide launch, and the output is coupled to the output waveguide launch; and
a ground referenced test system including an input port for receiving a ground referenced test signal representing the floating signal from the output of the probe, wherein the input port of the test system is galvanically isolated from the device under test.

20. The test network of claim 19, wherein the ground referenced test system comprises an oscilloscope.

* * * * *